United States Patent [19]

Scordo

[11] Patent Number: 4,633,193

[45] Date of Patent: Dec. 30, 1986

[54] CLOCK CIRCUIT SYNCHRONIZER USING A FREQUENCY SYNTHESIZER CONTROLLED BY A FREQUENCY ESTIMATOR

[75] Inventor: Dominick Scordo, Middletown, N.J.

[73] Assignee: AT&T Bell Laboratories, Murray Hill, N.J.

[21] Appl. No.: 805,124

[22] Filed: Dec. 2, 1985

[51] Int. Cl.$^4$ ............................................. H03L 7/14
[52] U.S. Cl. ...................................... 331/1 A; 331/11; 331/14; 331/17; 331/25; 331/27; 328/155
[58] Field of Search ..................... 331/1 A, 11, 14, 17, 331/25, 27, 2; 328/155

[56] References Cited

U.S. PATENT DOCUMENTS

| | | | |
|---|---|---|---|
| 4,135,166 | 1/1979 | Marchetti | 331/14 |
| 4,305,045 | 12/1981 | Metz et al. | 331/1 A |
| 4,360,781 | 11/1982 | Sochor | 331/17 X |
| 4,500,851 | 2/1985 | Sawa et al. | 331/2 |

*Primary Examiner*—Siegfried H. Grimm

*Attorney, Agent, or Firm*—Thomas Stafford

[57] ABSTRACT

Synchronization of a local timing signal with an incoming reference timing signal is realized by employing a frequency estimator and frequency synthesizer in conjunction with a local fixed oscillator. The frequency estimator includes a first phase-locked loop including an integrator for generating a frequency estimate which is the difference between the frequency of the incoming reference timing signal and the frequency of the fixed oscillator signal. The phase value of the frequency estimate obtained by integrating the frequency estimate is supplied to a second phase-locked loop which includes a digitally controlled oscillator to generate the local timing signal. If the incoming reference timing signal is lost or if there is too large a variation in a phase error signal in the first phase-locked loop, the value of the frequency estimate is held constant. Consequently, the second phase-locked loop never free runs and the local timing signal remains in synchronization with the reference timing signal.

14 Claims, 10 Drawing Figures

CLOCK CIRCUIT SYNCHRONIZER USING A FREQUENCY SYNTHESIZER CONTROLLED BY A FREQUENCY ESTIMATOR

TECHNICAL FIELD

This invention relates to clock circuits for use in digital transmission systems and, more particularly, relates to circuit arrangements for synchronizing local clock circuits at nodes in the transmission system.

BACKGROUND OF THE INVENTION

It is well recognized that it is desirable to be able to transmit synchronously digital signals from one node to another in a digital transmission system. However, if the average rate of transmission of bits from a node is not exactly equal to the average rate incoming to the node, errors occur. Such errors are defined as slips. A slip means that bits are arbitrarily deleted if the input transmission rate exceeds the output rate, or that bits are repeated or inserted arbitrarily if the input transmission rate is slower than the output rate. To assure synchronization and avoid slips, the nodes must be synchronized to a common reference signal. To this end, each node includes a local timing signal generator, commonly referred to as a local clock, which generates timing signals at a predetermined frequency. The local clock is adjusted to be in synchronization with a reference signal.

One known arrangement for realizing the desired synchronization is described in U.S. Pat. No. 4,305,045 issued to Reinhart Metz et al on Dec. 8, 1981. Disclosed are a frequency estimating and synthesizing arrangement that includes a programmable controller as part of a single phase lock loop to control digitally an oscillator for obtaining the desired synchronization of the local clock. A problem arises with such arrangements when the reference timing signal link to the node fails. In such an event, the digitally controlled oscillator is allowed to free run at the long-term average frequency known at the node at the time of the failure. Consequently, the free run stability of the digitally controlled oscillator is of critical importance in order to maintain performance objectives. Such arrangements typically included precision crystal oscillators which are controlled via a digital-to-analog converter. In such oscillator arrangements, all of the circuitry is typically enclosed in one or more oven chambers to provide a stable temperature environment. Desirable features of such arrangements include high digital control frequency resolution and high stability, among others. These features present conflicting design constraints which are difficult to accommodate. Moreover, the high stability constraint of such prior arrangement is expensive to obtain.

SUMMARY OF THE INVENTION

Problems associated with prior frequency estimating and synthesizing arrangements are overcome, in accordance with an aspect of the invention, by separating the frequency estimating and the frequency synthesizing functions.

The frequency estimating is realized by employing a phase-locked loop and a local high stability fixed frequency oscillator to compute an estimate of the frequency difference between the received reference timing signal frequency and the frequency of the signal from the local fixed oscillator. Then, a phase value corresponding to the frequency estimate value is supplied to a frequency synthesizer including a phase-locked oscillator to control a digitally controlled oscillator for generating a signal having a frequency which equals the algebraic sum of the fixed frequency and the computed frequency difference.

When the reference timing signal is lost and/or a phase error is too great, the last generated frequency difference estimate value is retained at a constant value and continuously supplied to the phase-locked oscillator. Consequently, the phase-locked oscillator is never allowed to free run, thereby yielding an output with a stability equal to the fixed frequency oscillator without the need for an extremely stable digitally controlled oscillator.

More specifically, the frequency estimating is realized, in accordance with an aspect of the invention, by sampling an incoming reference timing signal with the output signal from a fixed oscillator to obtain a sampled input phase signal and employing a phase-locked loop. The phase-locked loop includes an algebraic difference circuit for generating a phase error signal which is the difference between the sampled input phase signal and a local phase signal. Then, a loop compensation filter is supplied with the phase error signal to generate an estimate of a frequency difference between the incoming reference timing signal frequency and the oscillator output signal frequency. The estimate signal is integrated, in accordance with another aspect of the invention, to generate the local phase signal. The local phase signal is phase-locked to the incoming reference timing signal.

An output timing signal is generated, in accordance with another aspect of the invention, by supplying the local phase signal to a second phase-locked loop. The second phase-locked loop includes a digitally controlled oscillator which is controlled by a frequency control signal to generate the output timing signal. A sampled output phase signal is generated by sampling the output timing signal with the output from the fixed oscillator. A second phase error signal is generated by obtaining the algebraic difference of the local phase signal from the frequency estimator and the sampled output phase signal. The second phase error signal is supplied to a second loop compensation filter which generates the frequency control signal for controlling the frequency of the digitally controlled oscillator.

In one specific embodiment of the invention, a single processor is employed in conjunction with a fixed oscillator, two phase samplers and a digitally controlled oscillator to realize both the phase-locked loop which generates the frequency difference estimate value and the phase-locked oscillator which generates the desired output timing signal.

In another embodiment of the invention, first and second frequency estimators are employed for generating first and second frequency difference estimates between first and second received reference timing signals, respectively, and the frequency of the local fixed oscillator signal. A selector is employed to select one of the frequency estimates in accordance with predetermined criteria. The selected estimate is then integrated to obtain a corresponding phase value which is supplied to the frequency synthesizer phase-locked oscillator. The frequency synthesizer includes in the phase-locked loop a digitally controlled oscillator that generates the desired synchronization signal. If one of the incoming reference timing signals is lost and/or the associated phase error is too great, the frequency estimate generated from the other reference timing signal is selected. If both of the reference timing signals are lost and/or the associated phase errors are too great, the frequency estimate from the last non-lost reference timing signal is selected having an associated phase error within prescribed limits.

BRIEF DESCRIPTION OF THE DRAWING

The invention will be more fully understood from the following detailed description of illustrative embodiments taken in connection with the appended figures in which.

DETAILED DESCRIPTION

Figure 1:
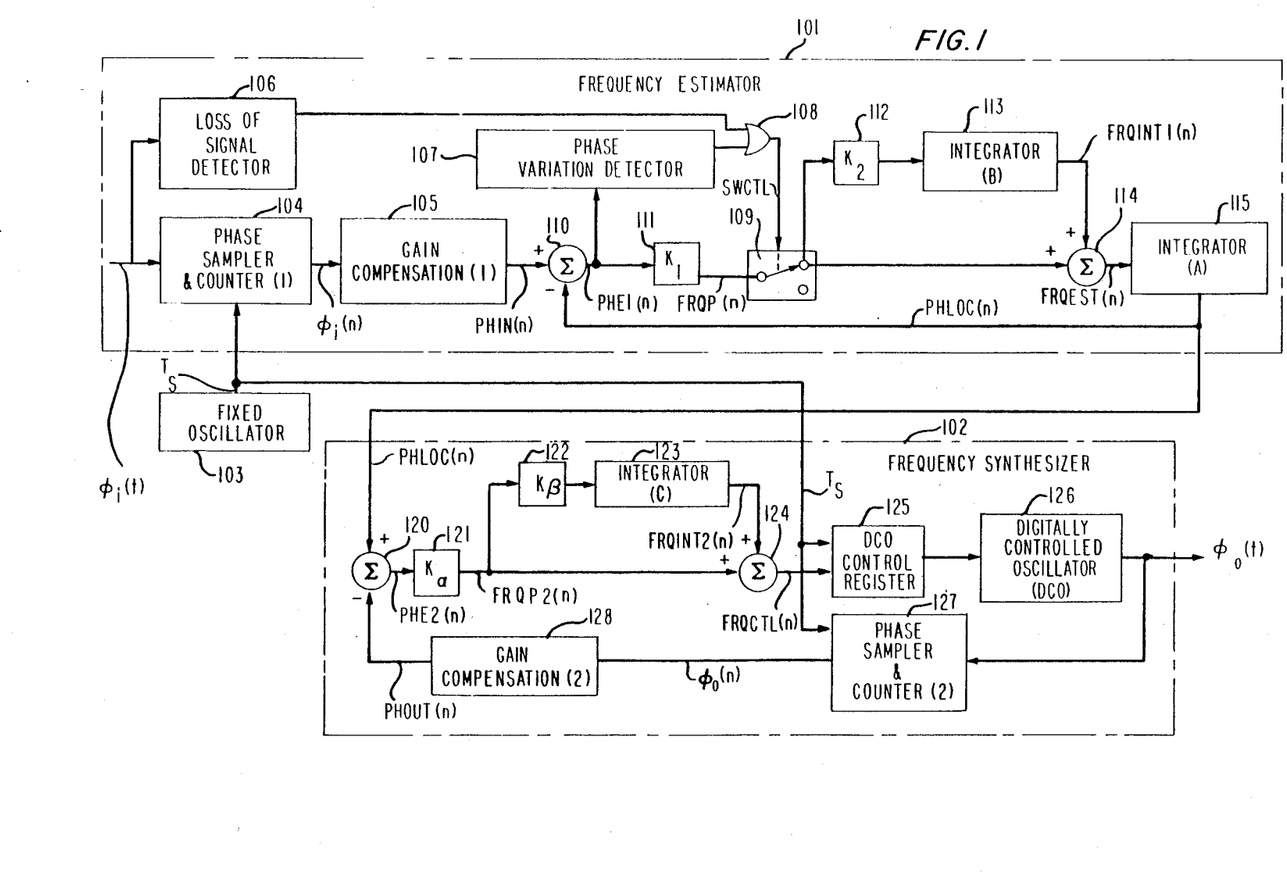
FIG. 1 shows in simplified block diagram form an embodiment of the invention.

FIG. 1 shows in simplified block diagram form a synchronization arrangement including an embodiment of the invention. In accordance with an aspect of the invention, instead of employing high precision digitally controlled variable frequency oscillators of the prior art which required expensive temperature compensation ovens and the like, a simpler precision fixed oscillator is employed as a local frequency reference in conjunction with a digital phase-locked loop to obtain a signal representation of the frequency of an incoming reference timing signal relative to the local oscillator frequency reference.

Additionally, the local frequency reference is employed in conjunction with another phase-locked loop to synthesize a signal using "low" quality, as compared to the prior high precision variable oscillators, so that the frequency of the synthesized signal is identical to a long-term average of a desired timing signal reference. Consequently, if the incoming reference timing signal is lost, the stability of the frequency of the synthesized timing signal is related essentially to the stability of the local fixed oscillator. The decoupling of the estimation and synthesis functions allows treatment of each on an individual basis and relaxes design constraints. This results in the use of a lower cost fixed precision oscillator and variable frequency oscillator as compared to the higher cost precision variable frequency oscillators used heretofore.

Accordingly, shown in FIG. 1 are frequency estimator 101, frequency synthesizer 102 and fixed precision oscillator 103. Frequency estimator 101 includes phase sampler and counter (1) 104, gain compensation circuit 105 and a controllable phase-locked loop. Additionally, included are loss of signal detector 106, phase variation detector 107, OR gate 108 and controllable switch 109. The phase-locked loop is, in this example, a so-called second order proportional-plus integral control type. The phase-locked loop includes summer 110, proportional gain unit (K1) 111, integral gain unit (K2) 112, integrator (B) 113, summer 114 and integrator (A) 115. Proportional gain unit (K1) 111, integral gain unit (K2) 112, integrator (B) 113 and summer 114 form a so-called loop compensation filter.

In the following description, it will be apparent to those skilled in the art that the digital modules employed in both frequency estimator 101 and frequency synthesizer 102 are being clocked via $T_s$ (not specifically shown).

Figure 4:
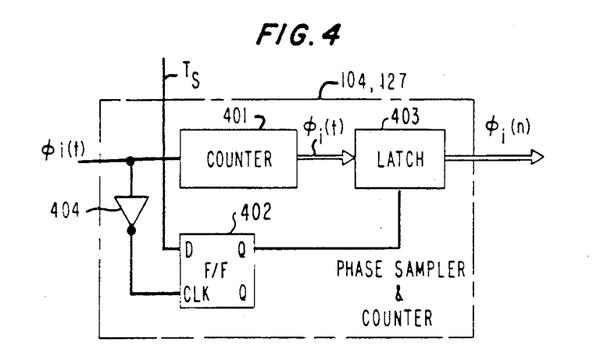
FIG. 4 depicts in simplified form details of the phase sampler and counter employed in FIGS. 1, 2, 6 and 7.

Details of sampler and counter (1) 104 are shown in FIG. 4. Accordingly, shown are counter 401, D-type flip-flop 402 and latch memory 403. The incoming timing signal $\phi_i(t)$ is supplied to counter 401 and, via inverter 404, to the clock input (CLK) of flip-flop 402. Counter 401 is, in this example, a modulo-$k_1$ counter. The value of $k_1$ is determined as $$k_1 = \text{closest integer of } [f_i T_s] \qquad (1)$$

where $f_i$ is the nominal frequency of the incoming timing link signal, for example, 1.544 MHz for domestic systems or 2.048 MHz for European systems, and $T_s$ is the sampling interval of the output from fixed oscillator 103, in this example, 1 millisecond. In this example, oscillator 103 has a precision of one part in $10^{10}$ per day. The local clock signal having period $T_s$ from fixed oscillator 103 (FIG. 1) is supplied to the D input of flip-flop 402. The Q output of flip-flop 402 is supplied to control latch memory 403. The output of counter 401 is supplied to latch memory 403. The count value in counter 401 is sampled and stored in latch memory 403 at every time interval $T_s$ in response to the Q output of flip-flop 402. Flip-flop 402 is included to insure that the output of counter 401 is stable before storing its value in latch memory 403. The output $\phi_i(n)$ from latch memory 403 is supplied to gain compensation unit 105. Phase sampler and counter 104 generates output $\phi_i(n)$ which is a sampled representation of the continuous time signal $\phi_i(t)$ at sampling interval $T_s$ generated by fixed oscillator 103. It is noted that (n) indicates the $n^{th}$ sample at the $nT_s$ sampling interval.

Returning to FIG. 1, the output from phase sampler and counter (1) 104, $\phi_i(n)$, is supplied to gain compensation unit 105. As indicated above, the characteristics of phase sampler and counter (1) 104 are such that $k_1$ steps represent one cycle of the output signal $\phi_i(n)$. The value $k_1$ depends on the sampling rate, $T_s$, and on the input signal frequency, $f_i$. Accordingly, phase sampler and counter (1) 104 provides a "gain" factor $$K_{ps}1 = k/2^N \qquad (2)$$

where N is the number of bits at the output of latch memory 403 (FIG. 4) and $k_1$ is the modulo of phase sampler and counter (1) 104. This gain factor $K_{ps}1$ is nulled out by gain compensation unit 105. Therefore, the output from gain compensation unit 105, which is the input to the phase-locked loop of frequency estimator 101, is $$PHIN(n) = 1/K_{ps}1 \phi_i(n) \qquad (3)$$

The phase-locked loop employed in frequency estimator 101 is a so-called second order proportional-plus integral control type where $K_1$ is the proportional gain and $K_2$ is the integral gain. The proportional gain term $K_1$ produces short term frequency variations required to minimize the phase error. The integral gain term $K_2$ represents a long term frequency average equal to the integrator (A) 115 input to obtain frequency lock. Accordingly, the incoming phase signal PHIN(n) is supplied to a first input of summer 110 while the local phase signal PHLOC from integrator (A) 115 is supplied to a second input of summer 110. Summer 110 generates the algebraic difference of the supplied signals, namely, $$PHE1(n)=PHIN(n)-PHLOC(n) \qquad (4)$$

which represents the phase error to be corrected and thereby achieving phase-lock in the loop. The phase difference error PHE1(n) is supplied to proportional gain ($K_1$) unit 111 which generates the proportional frequency term FRQP1(n), namely, $$FRQP1(n)=K_1 \cdot PHE1(n). \qquad (5)$$

The proportional frequency term FRQP1(n) from $K_1$ gain unit 111 is supplied via controllable switch 109 to $K_2$ gain unit 112 and a first input of summer 114. The output of $K_2$ gain unit 112 is supplied to integrator (B) 113 which, in turn, generates integral frequency term FRQINT1(n) and supplies the same to a second input of summer 114. Integrator (B) 113 updates the integral frequency term FRQINT1(n) as follows:

$$FRQINT1(n+1)=(FRQP1(n) \cdot K2)+FRQINT1(n). \qquad (6)$$

Summer 114 generates the desired frequency estimate, namely, $$FRQEST(n)=FRQP1(n)+FRQINT1(n). \qquad (7)$$

The frequency estimate output from summer 114 is supplied to integrator (A) 115 which generates the phase-lock signal PHLOC(n). PHLOC(n) is updated in integrator (A) 115 as follows:

$$PHLOC(n+1)=FRQEST(n)+PHLOC(n). \qquad (8)$$

The use of integrator (A) 115 effectively decouples the frequency estimation process from the frequency synthesis process, in accordance with an aspect of the invention. The decoupling is realized because integrator (A) 115 is a digital model of a voltage-controlled oscillator that normally would be used in a phase-locked loop to generate the local phase signal PHLOC(n) substantially equal to input phase signal PHIN(n). It is important to note that the output of integrator (A) 115 is a value represented in digital form. It is also desirable that the frequency estimate FRQEST generated by frequency estimator 101 should have higher resolution than $k_1$ steps in order to reduce the quantization noise.

Also important to the invention is inhibiting changes to the frequency estimate input, namely, FRQEST, of integrator (A) 115. This inhibiting is realized, in accordance with an aspect of the invention, by employing controllable switch 109 effectively to cause a zero value input to be supplied directly to the first input of summer 114 and, via $K_2$ gain unit 112 and integrator (B) 113, to the second input of summer 114 when either there is a loss of the incoming timing signal $\phi_i(t)$ or too large a phase variation in the phase error signal PHE1(n). The amount and type of phase variation is system-dependent and, consequently, will be different for each particular application. In one example, any phase error greater than 10 microseconds of phase is unacceptable. Switch 109 is controlled by an output from OR gate 108. Consequently, loss of signal detector 106 supplies a control signal to a first input of OR gate 108 indicative of whether incoming timing signal $\phi_i(t)$ is present or not. A logical 1 indicates that $\phi_i(t)$ is lost.

Similarly, an output from phase variation detector 107 is supplied to OR gate 108 indicative of whether the phase error PHE1(n) is too large or not. A logical 1 signal indicates that PHE1(n) is outside prescribed limits (10 microseconds in this example). Controllable switch 109 is responsive to the logical 1 signal from OR gate 108 to open-circuit the circuit connection between gain unit 111 and gain unit 112 and summer 114 when either loss of incoming timing signal $\phi_i(t)$ is detected or a variation in the phase value of PHE1(n) greater than a predetermined threshold is detected. Opening of controllable switch 109 inhibits updating of integrator (B) 113 and integrator (A) 115. That is to say, a zero value signal is supplied to integrator (B) 113 and to the first input of summer 114. Consequently, the frequency estimate FRQEST(n) remains constant at its long-term average value, in accordance with an aspect of the invention, and integrator (A) 115 continues to integrate FRQEST(n) in accordance with equation (8) at interval $T_s$ to generate PHLOC(n). Thus, PHLOC(n) continues to have a constant rate of change as though frequency estimator 101 was still in phase-lock with the incoming reference timing signal $\phi_i(t)$.

The local phase signal PHLOC(n) from frequency estimator 101 is supplied to frequency synthesizer 102 which also includes a phase-locked loop. Included in the frequency synthesizer 102 phase-locked loop are summer 120, $K_\alpha$ gain unit 121, $K_\beta$ gain unit 122, integrator (C) 123, summer 124, sampler 125, digitally controlled oscillator 126, phase sampler and counter (2) 127 and gain compensation unit 128. $K_\alpha$ gain unit 121, $K_\beta$ gain unit 122, integrator (C) 123 and summer 124 form a so-called loop compensation filter.

The output PHLOC(n) from frequency estimator 101 is supplied to a first input of summer 120 in frequency synthesizer 102. The gain compensated output PHOUT(n) from gain compensation unit 128 is supplied to a second input of summer 120. Summer 120 yields the algebraic difference signal PHE2(n), where $$PHE2(n)=PHLOC(n)-PHOUT(n). \qquad (9)$$

The output from summer 120 is supplied to proportional gain $K_\alpha$ unit 121. Gain unit 121 generates $$FRQP2(n)=K\alpha \cdot PHE2(n). \qquad (10)$$

In turn, the output FRQP2(n) from $K_\alpha$ gain unit 121 is supplied to a first input of summer 124 and to integral gain $K_\beta$ unit 122. The output from $K_\beta$ gain unit 122 is supplied to integrator (C) 123. The integrated output from integrator (C) 123 is supplied to a second input of summer 124. Integrator (C) 123 updates the integral frequency term FRQINT2(n) as follows:

$$FRQINT2(n+1)=(FRQP2(n) \cdot K\beta)+FRQINT2(n). \qquad (11)$$

Summer 124 generates the desired sampled frequency control signal $$FRQCTL(n)=FRQP2(n)+FRQINT2(n). \qquad (12)$$

The frequency control signal FRQCTL(n) is latched in DCO control register 125 at each interval $T_s$. Register 125 holds the value of FRQCTL(n) constant during the local sampling interval $T_s$. The latched value of FRQCTL(n) is supplied to digitally controlled oscillator (DCO) 126 which generates the desired output timing signal $\phi_o(t)$.

Figure 3:
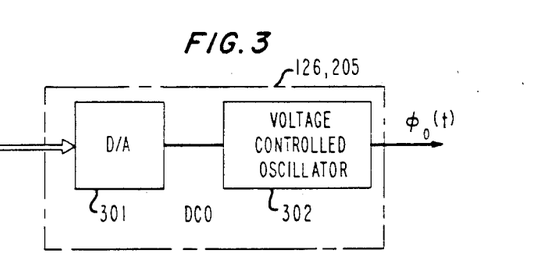
FIG. 3 shows in simplified block diagram form details of the digitally controlled oscillator (DCO) used in FIGS. 1, 2, 6 and 7.

Details of DCO 126 are shown in simplified form in FIG. 3. Accordingly, shown are digital-to-analog (D/A) converter 301 and voltage-controlled oscillator 302 which operate in well-known fashion to generate the desired output timing signal $\phi_o(t)$. It should be noted, however, that the precision of VCO 302 can be much lower than prior VCO's used in the prior single phase-locked loop frequency synthesizer arrangements. This is because of the fact that the frequency estimator 101 output is held constant when the incoming timing signal is lost and, therefore, frequency synthesizer 102 is always in phase-lock and never free runs. Because prior VCO's were allowed to free run when the incoming timing signal was lost, they were required to have extremely stable frequency characteristics when the input control signal was constant.

Returning to FIG. 1, the output timing signal $\phi_o(t)$ is supplied to phase sampler and counter(2) 127 which generates a sampled signal $\phi_o(n)$. Phase sampler and counter(2) 127 is essentially identical to phase sampler and counter(1) 104 as shown in FIG. 4. Accordingly, $\phi_o(n)$ is generated in the same fashion as $\phi_i(n)$ described above. The only difference is that $$k_2 = \text{closest integer of } [f_o \cdot T_s]. \quad (13)$$

It is noted that $$f_o = k_2/k_1 f_i \quad (14)$$

where $f_o$ is the frequency of output signal $\phi_o(t)$ and $f_i$ is the frequency of input signal $\phi_i(t)$. The output from phase sampler and counter(2) 127, $\phi_o(n)$, is gain compensated via gain compensation unit 128 to yield PHOUT(n). Gain compensation unit 128 is essentially identical to unit 105 and nulls out the phase sampler gain, namely, $K_{ps}2 = k_2/2^N$, to generate $$PHOUT(n) = 1/K_{ps}2\phi_o(n). \quad (15)$$

It is noted that when the input FRQEST(n) to integrator (A) 115 of frequency estimator 101 is held constant, the DCO 126 in frequency synthesizer 102 is not allowed to free run and the phase-locked loop remains in phase-lock with PHLOC(n). The frequency stability of output $\phi_o(t)$ is then dependent on the stability of fixed oscillator 103 and the number of bits used to represent the frequency estimate input FRQEST(n) to integrator (A) 115. In prior arrangements, the number of bits that could be used to represent FRQEST(n) was limited because a digital-to-analog (D/A) converter was required for use with a VCO. The more bits used in such D/A converters increased their cost.

Figure 2:
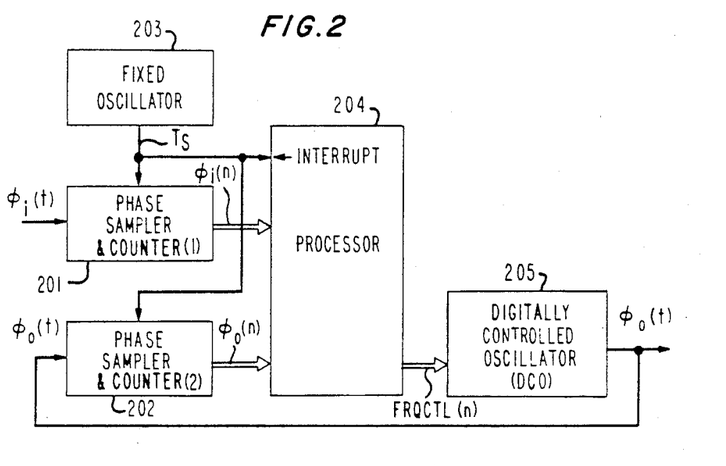
FIG. 2 depicts in simplified block diagram form another embodiment of the invention.

FIG. 2 shows a processor-implemented embodiment of the invention corresponding to the embodiment of FIG. 1. Accordingly, shown are phase sampler and counter 201, phase sampler and counter 202, fixed precision oscillator 203, processor 204 and digitally controlled oscillator (DCO) 205. Processor 204 includes a microcomputer arrangement of a type known in the art. In this example, an Intel 80186 is used. The incoming reference timing signal, $\phi_i(t)$, is supplied to phase sampler and counter 201 which, in response to the local timing signal having period $T_s$ from fixed oscillator 203, generates the sampled timing signal $\phi_i(n)$. Similarly, phase sampler and counter 202 is supplied with the output timing signal $\phi_o(t)$ from DCO 205 to generate a sampled output signal $\phi_o(n)$ in response to the local timing signal from fixed oscillator 203. The sampled incoming timing signal $\phi_i(n)$ and sampled output timing signal $\phi_o(n)$ are supplied to processor 204. Phase sampler and counter circuits 201 and 202 are identical to that shown in FIG. 4 and described above. Also supplied to processor 204 is the local timing signal from fixing oscillator 203 which interrupts the processor at period $T_s$. Processor 204 generates the frequency control signal FRQCTL(n) which is stored in a register of the processor 204 and supplied to DCO 205.

Figure 5:
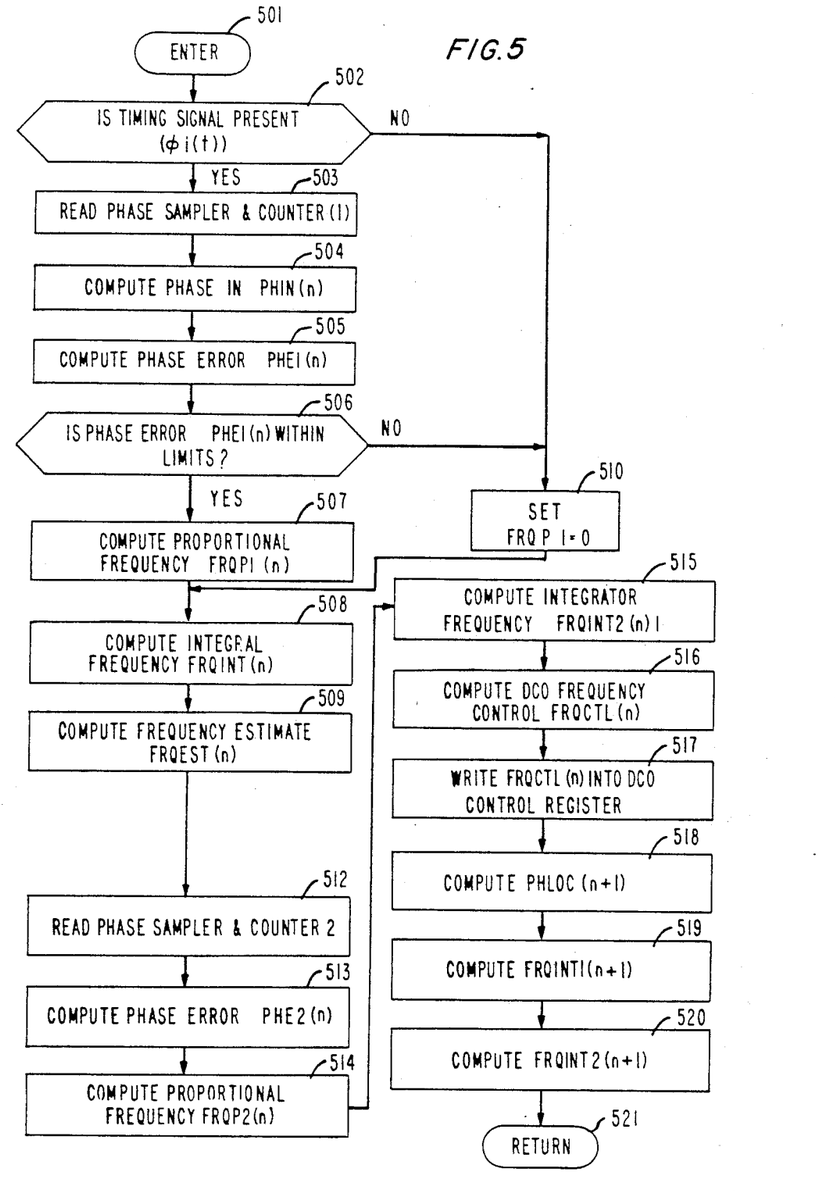
FIG. 5 is a flow chart illustrating the steps for operation of the embodiment of FIG. 2.

Operation of processor 204 in generating the frequency control signal FRQCTL(n) is shown in the flow chart of FIG. 5. Accordingly, the program routine is entered upon each interrupt generated at period $T_s$ via 501. Thereafter, conditional branch point 502 tests to determine whether incoming timing signal $\phi_i(t)$ is present. If the test result in step 502 is YES, operational block 503 causes phase sampler and counter (1) 201 to be read. This supplies $\phi_i(n)$ to the processor 204. Then, operational block 504 causes PHIN(n) to be computed. This is achieved by gain compensating $\phi_i(n)$ as described in equation (3) above. Operational block 505 causes the computation of the phase error 1 signal, PHE1(n), in accordance with equation (4) above. Conditional branch point 506 tests to determine that the phase error PHE1(n) is within predetermined limits. If the test result in step 506 is YES, operational block 507 causes the computation of proportional frequency term FRQP1(n), in accordance with equation (5) above. Then, operational block 508 causes the computation of integral frequency term FRQINT1(n), in accordance with equation (6) above. Thereafter, operational block 509 causes the computation of the desired frequency estimate, FRQEST(n), in accordance with equation (7) above.

Returning to step 502, if the test result is NO indicating that the incoming timing signal $\phi_i(t)$ has been lost, control is transferred to operational block 510 which causes the proportional frequency term FRQP1(n) to be set to zero. Similarly, if the test result in step 506 is NO indicating the phase error 1, PHE1(n), is too great, control is transferred to operational block 510 which causes the proportional frequency term FRQP1(n) to be set to zero. This is equivalent to opening switch 109 of FIG. 1 which inhibits updating of integrator (B) 113 (FIG. 1). Then. operational block 508 causes the integral frequency term FRQINT1(n) to be computed, in accordance with equation (6) above. Thereafter, operational block 509 causes the computation of the frequency estimate, FRQEST(n), in accordance wih equation (7) above. As indicated above, when the proportional frequency term FRQP1(n) is set to zero, the resulting frequency estimate, FRQEST(n), remains constant.

Operational block 512 causes the phase sampler and counter (2) 202 to be read which supplies the sampled version of the output signal $\phi_o(n)$ to processor 204 (FIG. 2). Operational block 513 causes computation of the phase error 2, PHE2(n), signal by gain compensating the sampled output signal $\phi_o(n)$ as described in equation (9) above. Operational block 514 causes computation of proportional frequency term FRQP2(n), in accordance with equation (10) above. Then, operational block 515 causes integral frequency term FRQINT2(n), to be computed in accordance with equation (11) above. Operational block 516 causes computation of the DCO 205 control signal, FRQCTL(n), in accordance with equation (12). Then, operational block 517 causes the DCO control signal, FRQCTL(n), to be written in a DCO control register which, in turn, supplies FRQCTL(n) to DCO 205 (FIG. 2) for generating the output timing signal $\phi_o(t)$. Operational block 518 causes the updated local phase signal PHLOC(n+1) to be computed in accordance with equation (8). Operational block 519 causes the updated integral frequency term FRQINT1(n+1) to be computed in accordance with equation (6). Operational block 520 causes the updated integral frequency term FRQINT2(n+1) to be computed in accordance with equation (11). Control is thereafter returned to some other process via 521 until the next interrupt causes re-entering of this routine.

Figure 6:
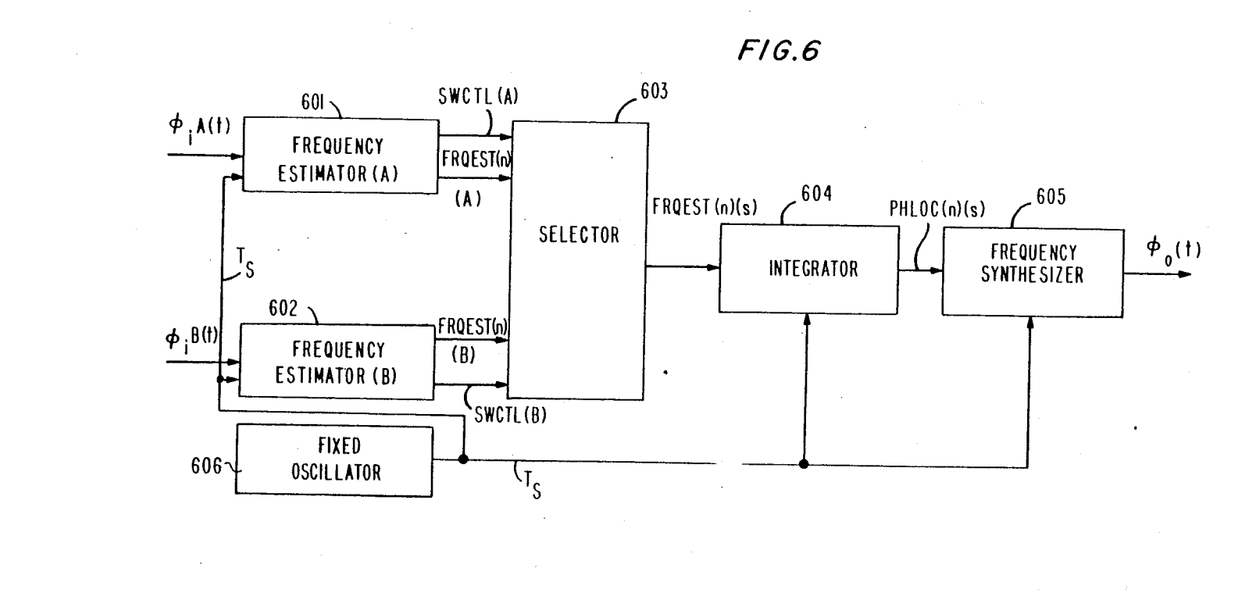
FIG. 6 shows in simplified block diagram form an embodiment of the invention including redundant frequency estimators.

FIG. 6 shows in simplified block diagram form details of a redundant synchronzation circuit with multiple timing reference signals, in accordance with an aspect of the invention. Accordingly, shown are frequency estimator (A) 601, frequency estimator (B) 602, selector 603, integrator (D) 604, frequency synthesizer 605 and fixed oscillator 606. First and second incoming timing signals $\phi_iA(t)$ and $\phi_iB(t)$ and the local timing signal having period $T_s$ from fixed oscillator 606 are supplied to frequency estimators 601 and 602, respectively. The output from oscillator 606 is also supplied to integrator 604 and frequency synthesizer 605. Frequency estimators 601 and 602 are essentially identical to frequency estimator 101 of FIG. 1 except that the frequency estimate signal, FRQEST(n)(A), and switch control signal, SWCTL(A), from estimator 601 and frequency estimate signal, FRQEST(n)(B), and switch control signal, SWCTL(B), from estimator 602 are supplied to selector 603. Selector 603 includes logic responsive to the switch control signals SWCTL(A) and SWCTL(B) for controllably selecting one of frequency estimate signals FRQEST(A) or FRQEST(B) to integrator (D) 604. The selection process is, if both SWCTL(A) and SWCTL(B) are false, i.e., representative of a logical 0, indicating both incoming timing signals $\phi_iA(t)$ and $\phi_iB(t)$ are present and that the corresponding phase errors PHE1(n)(A) and PHE1(n)(B) are within prescribed limits, then FRQEST(A) is selected. If either one of SWCTL(A) or SWCTL(B) is true, i.e., representative of a logical 1, indicating that the corresponding incoming timing signal is lost or that the corresponding phase error is outside the prescribed limits, the other one of frequency estimates FRQEST(n)(A) or FRQEST(n)(B) is selected. If both SWCTL(A) and SWCTL(B) are true, indicating that either both the timing signals $\phi_iA(t)$ and $\phi_iB(t)$ are lost or both the corresponding phase errors are out of limits or any combination thereof, the frequency estimate signal is selected corresponding to the last incoming timing signal which was present having a phase error within the prescribed limits.

The selected frequency estimate, FRQEST(n)(S), is supplied to integrator (D) 604. Integrator (D) 604 is identical to integrator (A) 115 of FIG. 1 and generates the selected local phase signal PHLOC(n)(S) in accordance with equation (8) above. The reason for employing the additional integrator (D) 604 is to avoid phase discontinuities that would result in the timing output signal $\phi_o(t)$ by switching the local phase signals PHLOC(n)(A) and PHLOC(n)(B) generated in frequency estimators 601 and 602, respectively. These discontinuities are avoided by supplying the frequency estimate signals FRQEST(n)(A) and FRQEST(n)(B) to selector 603 for switching and, then, integrating after the selection to obtain PHLOC(n)(S).

The local phase signal PHLOC(n)(S) is supplied to frequency synthesizer 605 which generates the output timing signal $\phi_o(t)$. Frequency synthesizer 605 is identical to frequency synthesizer 102 of FIG. 1 and described above.

Figure 7:
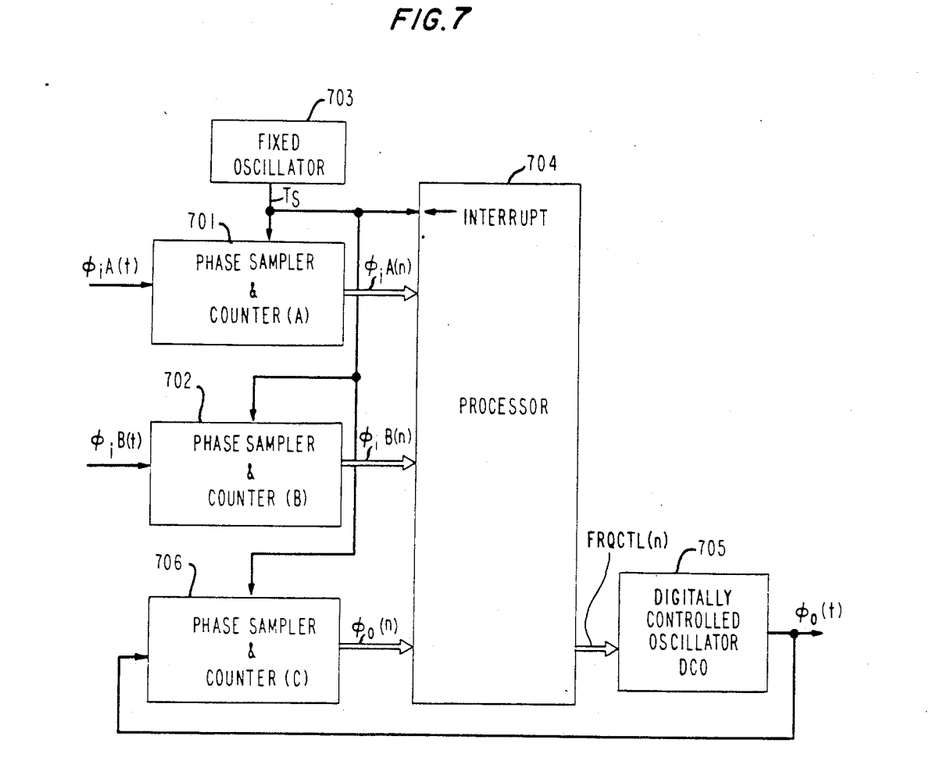
FIG. 7 depicts in simplified form details of another embodiment of the invention including redundant frequency estimators.

FIG. 7 shows in simplified block diagram form another embodiment of a redundant timing synchronization circuit, in accordance with an aspect of the invention. Accordingly, shown are phase sampler and counter (A) 701, phase sampler and counter (B) 702, fixed oscillator 703, processor 704, digitally controlled oscillator 705 and phase sampler and counter (C) 706. Processor 704 includes a microcomputer, for example, and Intel 80186. Phase sampler and counter circuits 701 and 702 are identical to phase sampler and counter 104 of FIG. 1 and described above. Similarly, phase sampler and counter 706 is identical to phase sampler and counter 127 of FIG. 1 and described above. Fixed oscillator 703 is identical to fixed oscillator 103 of FIG. 1 and DCO 705 is identical to DCO 126 of FIG. 1 and described above. Incoming timing signals $\phi_iA(t)$ and $\phi_iB(t)$ are supplied to phase sampler and counter (A) 701 and phase sampler and counter (B) 702, respectively. Phase sampler and counter (A) 701 and phase sampler counter (B) 702, in response to the fixed oscillator 703 output of period $T_s$, generate sampled versions of the incoming timing signals, namely, $\phi_iA(n)$ and $\phi_iB(n)$, respectively. Similarly, phase sampler and counter(C) 706 generates, in response to the fixed oscillator output signal, a sampled version of the output timing signal $\phi_o(t)$, namely, $\phi_o(n)$. These sampled signals, $\phi_iA(n)$, $\phi_iB(n)$ and $\phi_o(n)$, along with the fixed oscillator 703 output, are supplied to processor 704. Processor 704 is a microcomputer system having a program stored therein to effect the dual frequency estimation functions, the frequency estimate selection function, integration of the selected frequency estimate and generation of the DCO control signal, namely, FRQCTL(n). The output of a DCO control register in processor 704, namely, FRQCTL(n), is supplied to DCO 705 which, in turn, generates the output timing signal $\phi_o(t)$.

Figure 8:
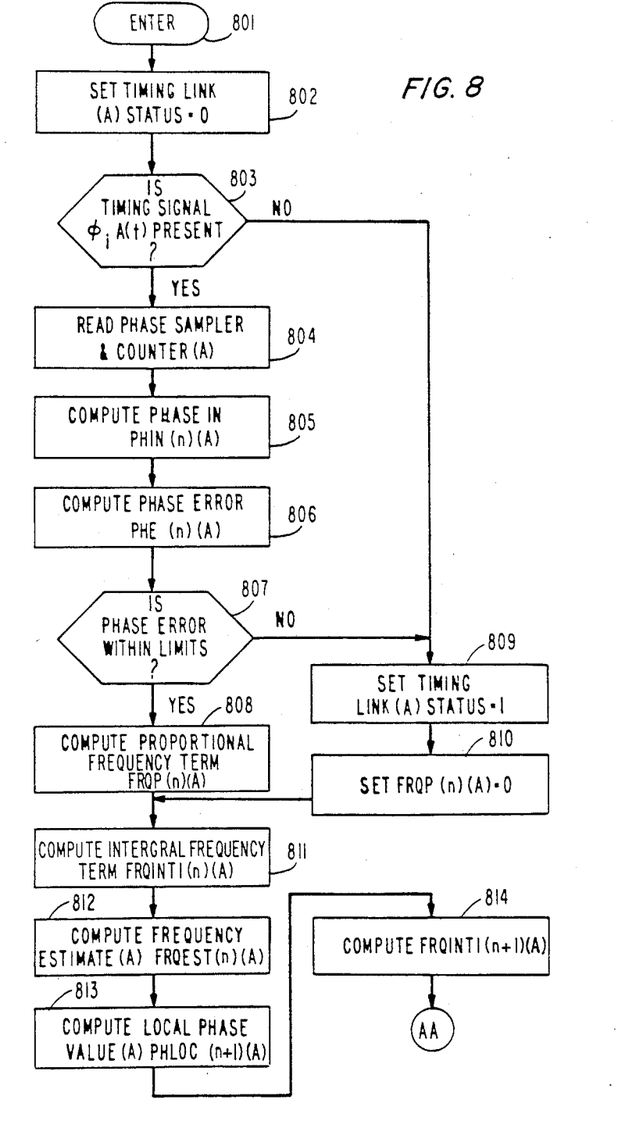
FIGS. 8, 9 and 10 form a flow chart illustrating the steps for operation of the embodiment of FIG. 7.
Figure 9:
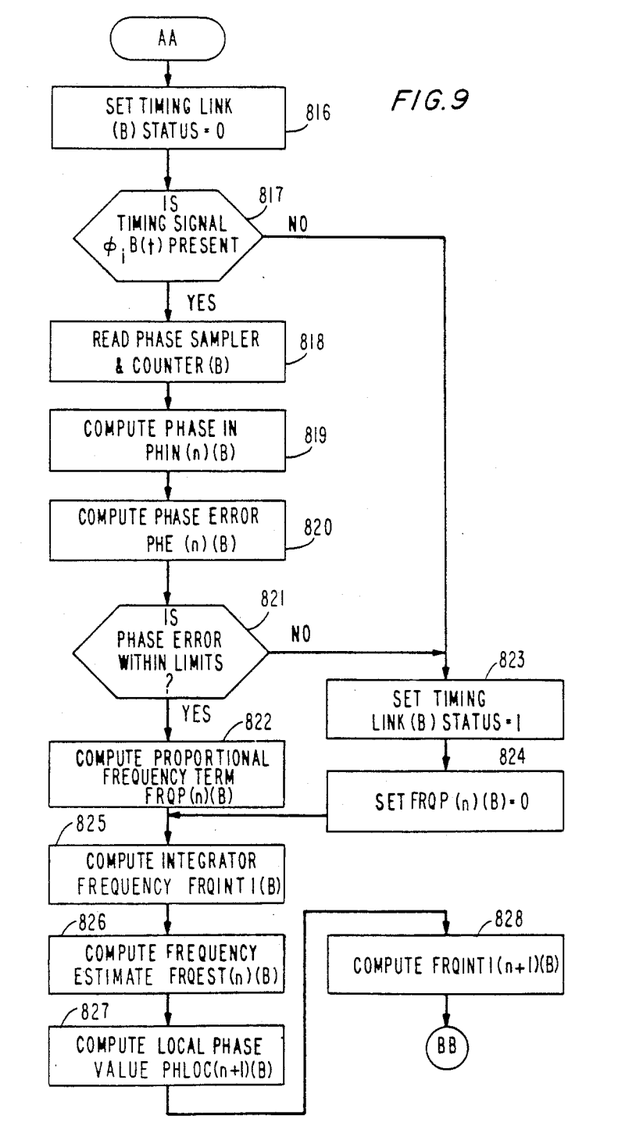
Figure 10:
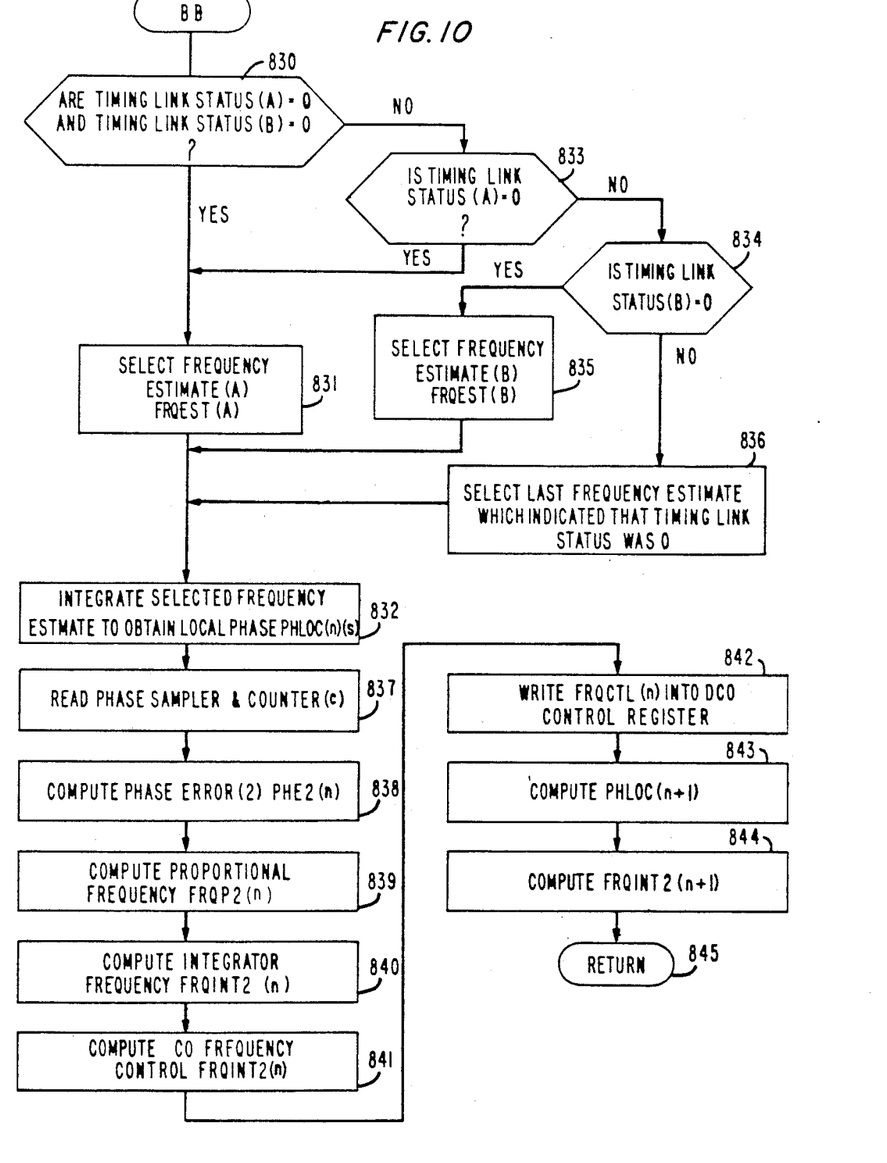

FIGS. 8, 9 and 10 when connected AA—AA and BB—BB form a flow chart of the steps of a program routine performed by processor 704 in generating DCO control signal FRQCTL(n) for controlling DCO 705 to generate the output timing signal $\phi_o(t)$. Accordingly, the program routine is entered via 801 in response to an interrupt caused by the fixed oscillator 703 output of period $T_s$. Thereafter, operational block 802 initially sets timing link (A) status to a logical 0. This initially indicates that the signal $\phi_iA(t)$ is present and not lost. Conditional branch point 803 tests to determine if incoming timing signal $\phi_iA(t)$ is present. If the test result in step 803 is YES, operational block 804 causes phase sampler and counter (A) 701 to be read. This supplies the sampled version $\phi_iA(n)$ of the incoming timing signal $\phi_iA(t)$ to processor 704. Then, operational block 805 causes the computation of the phase in (A), PHIN(n)(A), which is the gain compensated version of $\phi_iA(n)$, in accordance with equation (3) above. Operational block 806 causes the computation of the phase error (A), PHE1(n)(A), in accordance with equation (4) above. Conditional branch point 807 tests to determine if the phase error is within prescribed limits set for the particular system. If the test result in step 807 is YES, operational block 808 causes the computation of the proportional frequency term (A) FRQP(n)(A), in accordance with equation (5) above. Thereafter, operational block 811 causes the computation of integral frequency term (A) FRQINT(n)(A), in accordance with equation (6) above.

Returning to conditional branch point 803, if the test result is NO, the timing signal $\phi_i A(t)$ is lost and control is transferred to operational block 809. Similarly, if the test result in conditional branch point 807 is NO, the phase error is out of limits and control is transferred to operational block 809. Operational block 809 sets the incoming timing link (A) status to be a logical 1 indicating that the frequency estimate being generated in response to the incoming timing link signal $\phi_i A(t)$ should not be updated. To this end, operational block 810 sets the proportional frequency term (A) FRQP(n)(A)=0. This is essentially the same as opening switch 109 in FIG. 1. Thereafer, operational block 811 causes the computation of the integral frequency term (A) FRQINT1(n)(A), also in accordance with equation (6) above.

Operational block 812 causes the computation of frequency estimate (A), FRQEST(n)(A), in accordance with equation (7) above.

Operational block 813 causes the updated local phase PHLOC(n+1)(A) to be computed in accordance with equation (8) above.

Operational block 814 causes the updated integral frequency term FRQINT1(n+1)(A) to be computed in accordance with equation (6). This completes the steps in generating the frequency estimate (A), FRQEST(n)(A).

Steps 816 through 828 are identical to steps 801 through 814, respectively, except they effect the generation of frequency estimate (B) for incoming timing signal $\phi_i B(t)$. Accordingly, steps 816 through 828 will not be described again in detail.

Conditional branch point 830 tests the timing link status (A) and the timing link status (B) to determine if both incoming timing signals $\phi_i A(t)$ and $\phi_i B(t)$ are present. If the test result is YES, operational block 831 causes the frequency estimate (A), FRQEST(n)(A), to be selected for use in generating the desired output timing signal $\phi_o(t)$ and control is transferred to operational block 832. If the test result in step 830 is NO, conditional branch point 833 tests the timing link status (A) to determine if it is a logical 0, indicating that $\phi_i A(t)$ is present and that the corresponding phase error (A) is within limits. If the test result in step 833 is YES, operational block 831 causes selection of frequency estimate (A), FRQEST(n)(A), and control is transferred to operational block 832. If the test result in step 833 is NO, i.e., timing link status (A) is a logical 1, indicating that $\phi_i A(t)$ is not present or that the corresponding phase error (A) is not within limits, conditional branch point 834 tests the timing link status (B) to determine if timing link signal $\phi_i B(t)$ is present and that the corresponding phase error (B) is within limits. If the test result in step 834 is YES, operational block 835 causes the selection of frequency estimate (B), FRQEST(n)(B). Thereafter, control is transferred to operational block 832. If the test result in step 834 is NO, i.e., the timing link status (B) is a logical 1, indicating that $\phi_i B(t)$ is not present or that the corresponding phase error (B) is not within limits, operational block 836 causes the selection of the last one of frequency estimate (A), FRQEST(n)(A), or frequency estimate (B), FRQEST(n)(B), that the corresponding timing link status was a logical 0. That is to say, the frequency estimate is selected for the last timing link that indicated that the corresponding incoming timing signal was present and the corresponding phase error was within limits prior to the timing link status becoming a logical 1. Thereafter, control is transferred to operational block 832.

Operational block 832 causes the selected frequency estimate value to be integrated to obtain the local phase value, PHLOC(n)(S). The integration is the same as performed by integrator (D) 604 of FIG. 6 in accordance with equation (8) above.

Operational block 837 causes phase sampler and counter (C) to be read.

Operational block 838 causes the computation of the phase error (2), PHE2(n), in accordance with equation (9) above.

Operational block 839 causes the computation of the proportional frequency term FRQP2(n), in accordance with equation (10) above.

Operational block 840 causes the computation of integral frequency term FRQINT2(n), in accordance with equation (11) above.

Operational block 841 causes the computation of the DCO frequency control signal, FRQCTL(n), in accordance with equation (12) above.

Operational block 842 causes the DCO frequency control signal, FRQCTL(n), to be written into a register which stores the frequency control signal until it is updated. The frequency control signal, FRQCTL(n), is supplied to DCO 705 (FIG. 7).

Operational block 843 causes the updated local phase signal PHLOC(n+1)(S) to be computed in accordance with equation (8) for PHLOC(n+1).

Operational block 844 causes the updated integral frequency term FRQINT2(n+1) to be computed in accordance with equation (11).

Thereafter, the control is returned to a main process via 845 until the next interrupt is received from fixed oscillator 703.

What is claimed is:

1. Apparatus for generating an estimate of the frequency of an incoming reference timing signal comprising:

an oscillator for generating an output signal having a fixed frequency and corresponding period;

means for generating a sampled input phase signal by sampling the phase of said incoming reference timing signal with said oscillator output signal; and a digital phase-locked loop including means for algebraically combining said sampled input phase signal with a local phase signal to obtain a phase error signal which is the algebraic difference between said sampled input phase signal and said local phase signal, loop compensation filter means supplied with said phase error signal for generating an estimate signal representative of a frequency difference between said incoming reference timing signal frequency and said oscillator output signal frequency, and integrator means supplied with said estimate signal for generating said local phase signal, wherein said local phase signal is phase-locked to said incoming reference timing signal.

2. The invention as defined in claim 1 further including means for controllably inhibiting updating of said estimate signal.

3. The invention as defined in claim 2 wherein said means for controllably inhibiting includes means for detecting loss of said incoming reference timing signal, wherein said updating of said estimate signal is inhibited during intervals that loss of said incoming reference timing signal is detected.

4. The invention as defined in claim 3 wherein said means for controllably inhibiting further includes means for detecting a variation in said phase error signal greater than a predetermined value, wherein said updating of said estimate signal is inhibited during intervals that said phase error signal exceeds said predetermined value.

5. The invention as defined in claim 4 wherein said means for controllably inhibiting further includes means responsive to output signals from said means for detecting loss of said incoming reference timing signal and said means for detecting a variation in said phase error signal for controllably supplying a zero value signal to said loop compensation filter means.

6. Apparatus for generating an output timing signal comprising:
an oscillator for generating an output signal having a fixed frequency and corresponding period;
means for generating a sampled input phase signal by sampling the phase of an incoming reference timing signal with said oscillator output signal;
a first digital phase-locked loop including
means for algebraically combining said sampled input phase signal with a local phase signal to obtain a first phase error signal which is the algebraic difference between said sampled input phase signal and said local phase signal,
first loop compensation filter means supplied with said first phase error signal for generating an estimate signal representative of a frequency difference between said incoming reference timing signal frequency and said oscillator output signal frequency, and
integrator means supplied with said estimate signal for generating said local phase signal, wherein said local phase signal is phase-locked to said incoming reference timing signal; and
a second digital phase-locked loop including
a digitally controlled oscillator responsive to a frequency control signal for generating said output timing signal,
means for generating a sampled output phase signal by sampling the phase of said output timing signal with said oscillator output signal,
means for algebraically combining said sampled output phase signal with said local phase signal to obtain a second phase error signal which is the algebraic difference between said local phase signal and said sampled output phase signal,
second loop compensation filter means supplied with said second phase error signal for generating said frequency control signal, wherein said output timing signal is phase-locked to said local phase signal.

7. The invention as defined in claim 6 further including means for controllably inhibiting updating of said estimate signal.

8. The invention as defined in claim 7 wherein said means for controllably inhibiting includes means for detecting loss of said incoming reference timing signal, wherein said updating of said estimate signal is inhibited during intervals that loss of said incoming reference timing signal is detected.

9. The invention as defined in claim 8 wherein said means for controllably inhibiting further includes means for detecting a variation in said first phase error signal greater than a predetermined value, wherein said updating of said estimate signal is inhibited during intervals that said phase error signal exceeds said predetermined value.

10. The invention as defined in claim 9 wherein said means for controllably inhibiting further includes means responsive to output signals from said means for detecting loss of said incoming reference timing signals and said means for detecting a variation in said first phase error signal for controllably supplying a zero value signal to said first loop compensation filter means.

11. Apparatus for generating an output timing signal comprising:
an oscillator for generating an output signal having a fixed frequency and corresponding period;
first means for generating a first estimate signal representative of a frequency difference between a first incoming timing reference timing signal frequency and said oscillator output signal frequency including
means for generating a first sampled input phase signal by sampling the phase of said first incoming reference timing signal with said oscillator output signal, and
a first digital phase-locked loop including
means for algebraically combining said first sampled input phase signal with a first local phase signal to obtain a first phase error signal which is the algebraic difference between said first sampled input phase signal and said first local phase signal,
loop compensation filter means supplied with said first phase error signal for generating said first estimate signal, and
integrator means supplied with said first estimate signal for generating said first local phase signal, wherein said first local phase signal is phase-locked to said first incoming reference timing signal;
second means for generating a second estimate signal representative of a frequency difference between a second incoming timing reference signal frequency and said oscillator output signal frequency including
means for generating a secons sampling input phase signal by sampling the phase of said second incoming reference timing signal with said oscillator output signal, and
a second digital phase-locked loop including
means for algebraically combining said second sampled input phase signal with a second local phase signal to obtain a second phase error signal which is the algebraic difference between said second sampled input phase signal and said second local phase signal,
loop compensation filter means supplied with said second phase error signal for generating said second estimate signal, and
integrator means supplied with said second estimate signal for generating said second local phase signal, wherein said second local phase signal is phase-locked to said second incoming reference timing signal;

selector means supplied with said first estimate signal and said second estimate signal for controllably selecting one of said first and second estimate signals in accordance with prescribed criteria;

means for integrating said selected one of said first and second estimate signal to obtain a selected local phase signal; and a third digital phase-locked loop including a digitally controlled oscillator responsive to a frequency control signal for generating said output timing signal, means for generating a sampled output phase signal by sampling the phase of said output timing signal with said oscillator output signal, means for algebraically combining said sampled output phase signal with said selected local phase signal to obtain a third phase error signal which is the algebraic difference between said selected local phase signal and said sampled output timing signal, and loop compensation filter means supplied with said third phase error signal for generating said frequency control signal, wherein said output timing signal is phase-locked to said selected local phase signal.

12. The invention as defined in claim 11 wherein said first means for generating said first estimate signal includes means for controllably inhibiting updating of said first estimate signal and for generating a first control signal indicative of whether the updating of said first estimate signal is being inhibited and said second means for generating said second estimate signal includes means for controllably inhibiting updating of said second estimate signal and for generating a second control signal indicative of whether the updating of said second estimate signal is being inhibited.

13. The invention as defined in claim 12 wherein said selecting means includes means responsive to said first and second control signals for selecting one of said first and second estimate signals in accordance with said prescribed criteria.

14. The invention as defined in claim 13 wherein said prescribed criteria are: if both said first and second control signals indicate that updating of neither said first estimate signal nor said second estimate signal is being inhibited, select a predetermined one of said first and second estimate signals; if one of said first and second control signals indicates that updating of the corresponding one of said first and second estimate signals is being inhibited, select the one of said first and second estimate signals for which updating is not being inhibited; if both said first and second control signals indicate that updating of both said first and second estimate signals is being inhibited, select the last one of said first and second estimate signals for which updating was not being inhibited.

* * * * *